US012658227B2

(12) United States Patent
Wu et al.

(10) Patent No.: US 12,658,227 B2
(45) Date of Patent: Jun. 16, 2026

(54) MEMORY SUB-SYSTEM MANAGEMENT BASED ON DYNAMIC CONTROL OF WORDLINE START VOLTAGE

(71) Applicant: Micron Technolgy, Inc., Boise, ID (US)

(72) Inventors: Jiangang Wu, Milpitas, CA (US); Lei Zhou, Shanghai (CN); Jung Sheng Hoei, Newark, CA (US); Kishore Kumar Muchherla, Fremont, CA (US); Qisong Lin, El Dorado Hills, CA (US)

(73) Assignee: Micron Technology, Inc., Boise, ID (US)

( * ) Notice: Subject to any disclaimer, the term of this patent is extended or adjusted under 35 U.S.C. 154(b) by 145 days.

(21) Appl. No.: 18/587,427

(22) Filed: Feb. 26, 2024

(65) Prior Publication Data

US 2024/0203467 A1 Jun. 20, 2024

Related U.S. Application Data

(63) Continuation of application No. 17/415,657, filed as application No. PCT/CN2021/073765 on Jan. 26, 2021, now Pat. No. 11,915,785.

(51) Int. Cl.
*G11C 16/10* (2006.01)
*G11C 7/10* (2006.01)
(Continued)

(52) U.S. Cl.
CPC .............. *G11C 7/1096* (2013.01); *G11C 8/08* (2013.01); *G11C 8/14* (2013.01); *G11C 16/10* (2013.01)

(58) Field of Classification Search
CPC ........... G11C 7/1096; G11C 8/08; G11C 8/14; G11C 16/10; G11C 16/08
See application file for complete search history.

(56) References Cited

U.S. PATENT DOCUMENTS 7,177,199 B2 * 2/2007 Chen .................. G11C 16/3459
365/185.11
9,208,888 B1 12/2015 Wakchaure et al.
(Continued)

FOREIGN PATENT DOCUMENTS

CN 107544925 A 1/2018
CN 109815160 A 5/2019

OTHER PUBLICATIONS

PCT International Search Report and Written Opinion for International Application No. PCT/CN2021/073765 mailed Apr. 13, 2021, 9 pages.

(Continued)

*Primary Examiner* — Khamdan N. Alrobaie
(74) *Attorney, Agent, or Firm* — Lowenstein Sandler LLP

(57) ABSTRACT

A request to perform a write operation at a memory device is received. Current wordline start voltage (WLSV) information associated with a particular memory segment of the plurality of memory segments is retrieved. In a firmware record in a memory sub-system controller, information is stored indicative of a last written memory page associated with the particular memory segment on which the write operation is performed. The firmware record is managed in view of the information indicative of the last written memory page associated with the performed write operation. Each entry of the firmware record comprises one or more identifying indicia associated with a respective memory segment, at least one of the identifying indicia being a wordline start voltage (WLSV) associated with the respective memory segment, and the other indicia is a plane mask. Plane mask compatibility helps identify which pages can be programmed together in a multi-plane write operation.

20 Claims, 6 Drawing Sheets

(51) Int. Cl.
G11C 8/08 (2006.01)
G11C 8/14 (2006.01)

(56) References Cited

U.S. PATENT DOCUMENTS

| | | | |
|---|---|---|---|
| 9,236,133 | B2 | 1/2016 | Yanamanamanda et al. |
| 9,564,233 | B1 | 2/2017 | Cho et al. |
| 10,224,107 | B1 | 3/2019 | Sule et al. |
| 10,388,379 | B2 * | 8/2019 | Srinivasan ............... G11C 8/08 |
| 10,423,350 | B2 | 9/2019 | Arthasarathy et al. |
| 11,132,303 | B2 | 9/2021 | Wu et al. |
| 2014/0208007 | A1 | 7/2014 | Cohen et al. |
| 2015/0380095 | A1 * | 12/2015 | Wakchaure ............ G11C 16/26 |
| | | | 365/185.11 |
| 2016/0378576 | A1 | 12/2016 | Jayakumar et al. |
| 2017/0371779 | A1 * | 12/2017 | Rajwade ............. G11C 11/5628 |
| 2019/0129774 | A1 | 5/2019 | Konan et al. |
| 2021/0240635 | A1 * | 8/2021 | Wu ......................... G06F 12/12 |
| 2022/0130446 | A1 * | 4/2022 | Chen ................... G11C 11/4085 |

OTHER PUBLICATIONS

Office Action for Chinese Patent Application No. CN202180005060. 0, mailed Nov. 21, 2025, 11 Pages.

* cited by examiner

300

Receive a request to perform a write operation
305

Retrieve wordline start voltage record from memory device
310

Perform program operation
315

Store information indicative of the last written page
320

Manage firmware record in view of the performed write operation
325

400

MEMORY SUB-SYSTEM MANAGEMENT BASED ON DYNAMIC CONTROL OF WORDLINE START VOLTAGE

RELATED APPLICATIONS

This application is a Continuation of U.S. application Ser. No. 17/415,657, filed Jun. 17, 2021, which is US National Stage 371 Application of PCT Application No. PCT/CN2021/073765, filed Jan. 26, 2021, all of which are hereby incorporated by reference as is set forth in full in this application for all purposes.

TECHNICAL FIELD

Embodiments of the disclosure are generally related to memory sub-systems, and more specifically, are related to memory sub-system management based on wordline start voltage (WSLV) dynamically controlled by firmware.

BACKGROUND

A memory sub-system can include one or more memory devices that store data. The memory devices can be, for example, non-volatile memory devices and volatile memory devices. In general, a host system can utilize a memory sub-system to store data at the memory devices and to retrieve data from the memory devices.

BRIEF DESCRIPTION OF THE DRAWINGS

The present disclosure will be understood more fully from the detailed description given below and from the accompanying drawings of some embodiments of the disclosure.

DETAILED DESCRIPTION

Figure 1:
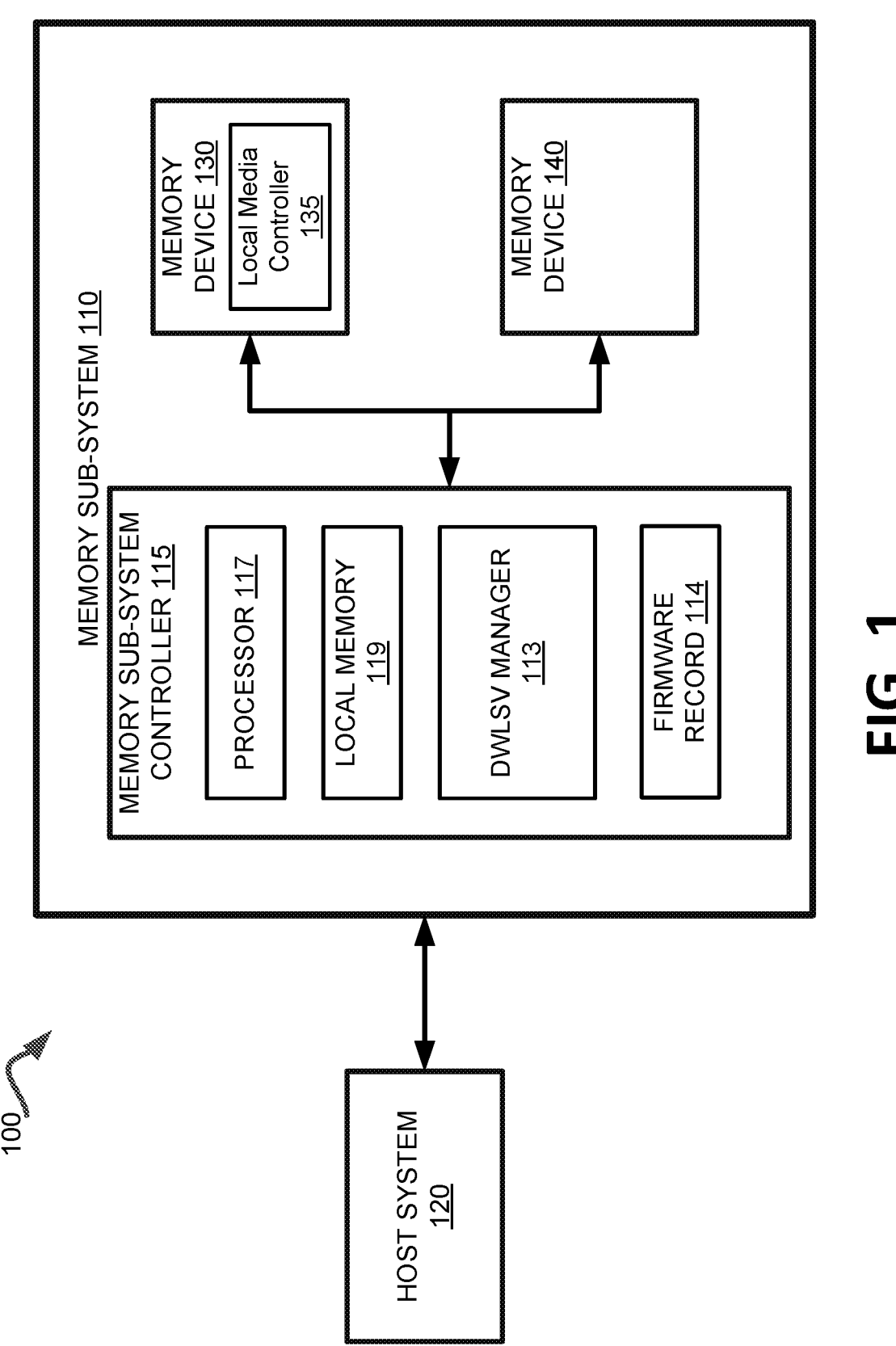
FIG. 1 illustrates an example computing system that includes a memory sub-system in accordance with some embodiments of the present disclosure.

Aspects of the present disclosure are directed to memory sub-system management based on dynamic control of wordline start voltage (WLSV). A memory sub-system can be a storage device, a memory module, or a combination of a storage device and memory module. Examples of storage devices and memory modules are described below in conjunction with FIG. 1. In general, a host system can utilize a memory sub-system that includes one or more components, such as memory devices that store data. The host system can provide data to be stored at the memory sub-system and can request data to be retrieved from the memory sub-system.

A memory sub-system can include high density non-volatile memory devices where retention of data is desired when no power is supplied to the memory device. One example of non-volatile memory devices is a negative-and (NAND) memory device. Other examples of non-volatile memory devices are described below in conjunction with FIG. 1. A non-volatile memory device is a package of one or more dies. Each die can consist of one or more planes. For some types of non-volatile memory devices (e.g., NAND devices), each plane consists of a set of physical blocks. Each block consists of a set of pages. Each page consists of a set of memory cells ("cells"). A cell is an electronic circuit that stores information. Depending on the cell type, a cell can store one or more bits of binary information, and has various logic states that correlate to the number of bits being stored. The logic states can be represented by binary values, such as "0" and "1", or combinations of such values.

A memory device can be made up of bits arranged in a two-dimensional grid. Memory cells are etched onto a silicon wafer in an array of columns (also hereinafter referred to as bitlines) and rows (also hereinafter referred to as wordlines). A wordline (WL) can refer to one or more rows of memory cells of a memory device that are used with one or more bitlines to generate the address of each of the memory cells. The intersection of a bitline and wordline constitutes the address of the memory cell. A block hereinafter refers to a unit of the memory device used to store data and can include a group of memory cells, a wordline group, a wordline, or individual memory cells. One or more blocks can be grouped together to form a plane of the memory device in order to allow concurrent operations to take place on each plane. The memory device can include circuitry that performs concurrent memory page accesses of two or more memory planes. For example, the memory device can include a respective access line driver circuit and power circuit for each plane of the memory device to facilitate concurrent access of pages of two or more memory planes, including different page types.

One of the existing techniques for memory management is a dynamic wordline start voltage (DWLSV) operation. In an automated dynamic wordline start voltage (ADWLSV) operation controlled at the memory device level, a page map is associated with a particular block of memory cells of a memory device. The memory device can apply one or more of an automated sequence of incremented voltages to determine the lowest voltage (e.g., wordline start voltage) at which the first page of the wordline can be programmed with valid data. The other pages of the same wordline can be programmed by the wordline start voltage determined for the first page of the wordline.

In some embodiments, a program operation does not write all the wordlines in a particular block, which leaves the particular block as an open block. An "open" block can refer to a physical block of memory cells where the pages of the block have not been completely written. In some embodiments, the block can remain open until a last page of the block is programmed. The block is closed after the last page of block is programmed. When a block is closed, the WLSV entry (i.e. the value of WLSV) for a particular block can be released and be made available for another block. Therefore, it is important to keep track of open and closed blocks in a memory sub-system in order to increase overall programming efficiency, as indicated by programming time ($t_{prog}$).

Typically there is only one DWSLV storage element (a user accessible register) allotted per die to store WLSV information. This poses substantial restriction in terms of the maximum number of open blocks in a die of which the memory device can keep track, as the available space for WLSV information can be quickly exhausted as the number of open blocks increases. Additional logic circuits and storage elements would need to be incorporated in the memory device in order to perform ADWLSV at a larger scale where a large number of open blocks can be tracked.

Aspects of the present disclosure address the above and other deficiencies by moving the dynamic wordline start voltage (DWLSV) operation from being performed at a memory device level to being performed at a memory sub-system controller level by manually or semi-automatically configuring firmware of the memory sub-system controller to determine an appropriate wordline start voltage for the first page of a particular wordline. The firmware controlled DWSLV operation is abbreviated as "manual" DWSLV, or MDWLSV, though the term "manual" encompasses a certain degree of automatic operation in conjunction with manual configuration of the firmware by a user. Therefore the phrase "manual or semi-automatic" is often used in the specification. Since MDWLSV is not limited to just one storage element per die to store WLSV records, a large scale DWLSV operation is feasible, involving a large number of (e.g., hundreds of) open blocks being tracked. By moving the DWLSV operation to the firmware, the memory device design can remain unchanged, while the number of open blocks being tracked can increase from single digit to hundreds or even thousands.

Advantages of controlling the DWLSV operation at the memory sub-system controller level rather than the memory device level include, but are not limited to, shorter overall programming time ($t_{prog}$), i.e. less programming time penalty without having to change storage capacity at the memory device level. Moreover, MDWLSV can also be performed for a multi-plane program operation, where multiple planes of a die can be written in parallel (e.g., concurrently), further increasing programming efficiency.

FIG. 1 illustrates an example computing system 100 that includes a memory sub-system 110 in accordance with some embodiments of the present disclosure. The memory sub-system 110 can include media, such as one or more volatile memory devices (e.g., memory device 140), one or more non-volatile memory devices (e.g., memory device 130), or a combination of such.

A memory sub-system 110 can be a storage device, a memory module, or a combination of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) card, and a hard disk drive (HDD). Examples of memory modules include a dual in-line memory module (DIMM), a small outline DIMM (SO-DIMM), and various types of non-volatile dual in-line memory modules (NVDIMMs).

The computing system 100 can be a computing device such as a desktop computer, laptop computer, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device.

The computing system 100 can include a host system 120 that is coupled to one or more memory sub-systems 110. In some embodiments, the host system 120 is coupled to multiple memory sub-systems 110 of different types. FIG. 1 illustrates one example of a host system 120 coupled to one memory sub-system 110. As used herein, "coupled to" or "coupled with" generally refers to a connection between components, which can be an indirect communicative connection or direct communicative connection (e.g., without intervening components), whether wired or wireless, including connections such as electrical, optical, magnetic, etc.

The host system 120 can include a processor chipset and a software stack executed by the processor chipset. The processor chipset can include one or more cores, one or more caches, a memory controller (e.g., NVDIMM controller), and a storage protocol controller (e.g., PCIe controller, SATA controller). The host system 120 uses the memory sub-system 110, for example, to write data to the memory sub-system 110 and read data from the memory sub-system 110.

The host system 120 can be coupled to the memory sub-system 110 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), a double data rate (DDR) memory bus, Small Computer System Interface (SCSI), a dual in-line memory module (DIMM) interface (e.g., DIMM socket interface that supports Double Data Rate (DDR)), etc. The physical host interface can be used to transmit data between the host system 120 and the memory sub-system 110. The host system 120 can further utilize an NVM Express (NVMe) interface to access components (e.g., memory devices 130) when the memory sub-system 110 is coupled with the host system 120 by the physical host interface (e.g., PCIe bus). The physical host interface can provide an interface for passing control, address, data, and other signals between the memory sub-system 110 and the host system 120. FIG. 1 illustrates a memory sub-system 110 as an example. In general, the host system 120 can access multiple memory sub-systems via a same communication connection, multiple separate communication connections, and/or a combination of communication connections.

The memory devices 130, 140 can include any combination of the different types of non-volatile memory devices and/or volatile memory devices. The volatile memory devices (e.g., memory device 140) can be, but are not limited to, random access memory (RAM), such as dynamic random access memory (DRAM) and synchronous dynamic random access memory (SDRAM).

Some examples of non-volatile memory devices (e.g., memory device 130) include a negative-and (NAND) type flash memory and write-in-place memory, such as a three-dimensional cross-point ("3D cross-point") memory device, which is a cross-point array of non-volatile memory cells. A cross-point array of non-volatile memory cells can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Each of the memory devices 130 can include one or more arrays of memory cells. One type of memory cell, for example, single level cells (SLC) can store one bit per cell. Other types of memory cells, such as multi-level cells (MLCs), triple level cells (TLCs), quad-level cells (QLCs), and penta-level cells (PLCs) can store multiple bits per cell. In some embodiments, each of the memory devices 130 can include one or more arrays of memory cells such as SLCs, MLCs, TLCs, QLCs, PLCs or any combination of such. In some embodiments, a particular memory device can include an SLC portion, and an MLC portion, a TLC portion, a QLC portion, or a PLC portion of memory cells. The memory cells of the memory devices 130 can be grouped as pages that can refer to a logical unit of the memory device used to store data. With some types of memory (e.g., NAND), pages can be grouped to form blocks.

Although non-volatile memory components such as a 3D cross-point array of non-volatile memory cells and NAND type flash memory (e.g., 2D NAND, 3D NAND) are described, the memory device 130 can be based on any other type of non-volatile memory, such as read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), negative-or (NOR) flash memory, or electrically erasable programmable read-only memory (EEPROM).

A memory sub-system controller 115 (or controller 115 for simplicity) can communicate with the memory devices 130 to perform operations such as reading data, writing data, or erasing data at the memory devices 130 and other such operations. The memory sub-system controller 115 can include hardware such as one or more integrated circuits and/or discrete components, a buffer memory, or a combination thereof. The hardware can include a digital circuitry with dedicated (i.e., hard-coded) logic to perform the operations described herein. The memory sub-system controller 115 can be a microcontroller, special purpose logic circuitry (e.g., a field programmable gate array (FPGA), an application specific integrated circuit (ASIC), etc.), or other suitable processor.

The memory sub-system controller 115 can include a processing device, which includes one or more processors (e.g., processor 117), configured to execute instructions stored in a local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, etc. The local memory 119 can also include read-only memory (ROM) for storing micro-code. While the example memory sub-system 110 in FIG. 1 has been illustrated as including the memory sub-system controller 115, in another embodiment of the present disclosure, a memory sub-system 110 does not include a memory sub-system controller 115, and can instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to the memory devices 130. The memory sub-system controller 115 can be responsible for other operations such as wear leveling operations, garbage collection operations, error detection and error-correcting code (ECC) operations, encryption operations, caching operations, and address translations between a logical address (e.g., a logical block address (LBA), namespace) and a physical address (e.g., physical block address) that are associated with the memory devices 130. The memory sub-system controller 115 can further include host interface circuitry to communicate with the host system 120 via the physical host interface. The host interface circuitry can convert the commands received from the host system into command instructions to access the memory devices 130 as well as convert responses associated with the memory devices 130 into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the memory sub-system controller 115 and decode the address to access the memory devices 130.

In some embodiments, the memory devices 130 include local media controllers 135 that operate in conjunction with memory sub-system controller 115 to execute operations on one or more memory cells of the memory devices 130. An external controller (e.g., memory sub-system controller 115) can externally manage the memory device 130 (e.g., perform media management operations on the memory device 130). In some embodiments, memory sub-system 110 is a managed memory device, which is a raw memory device 130 having control logic (e.g., local controller 132) on the die and a controller (e.g., memory sub-system controller 115) for media management within the same memory device package. An example of a managed memory device is a managed NAND (MNAND) device.

Figure 2:
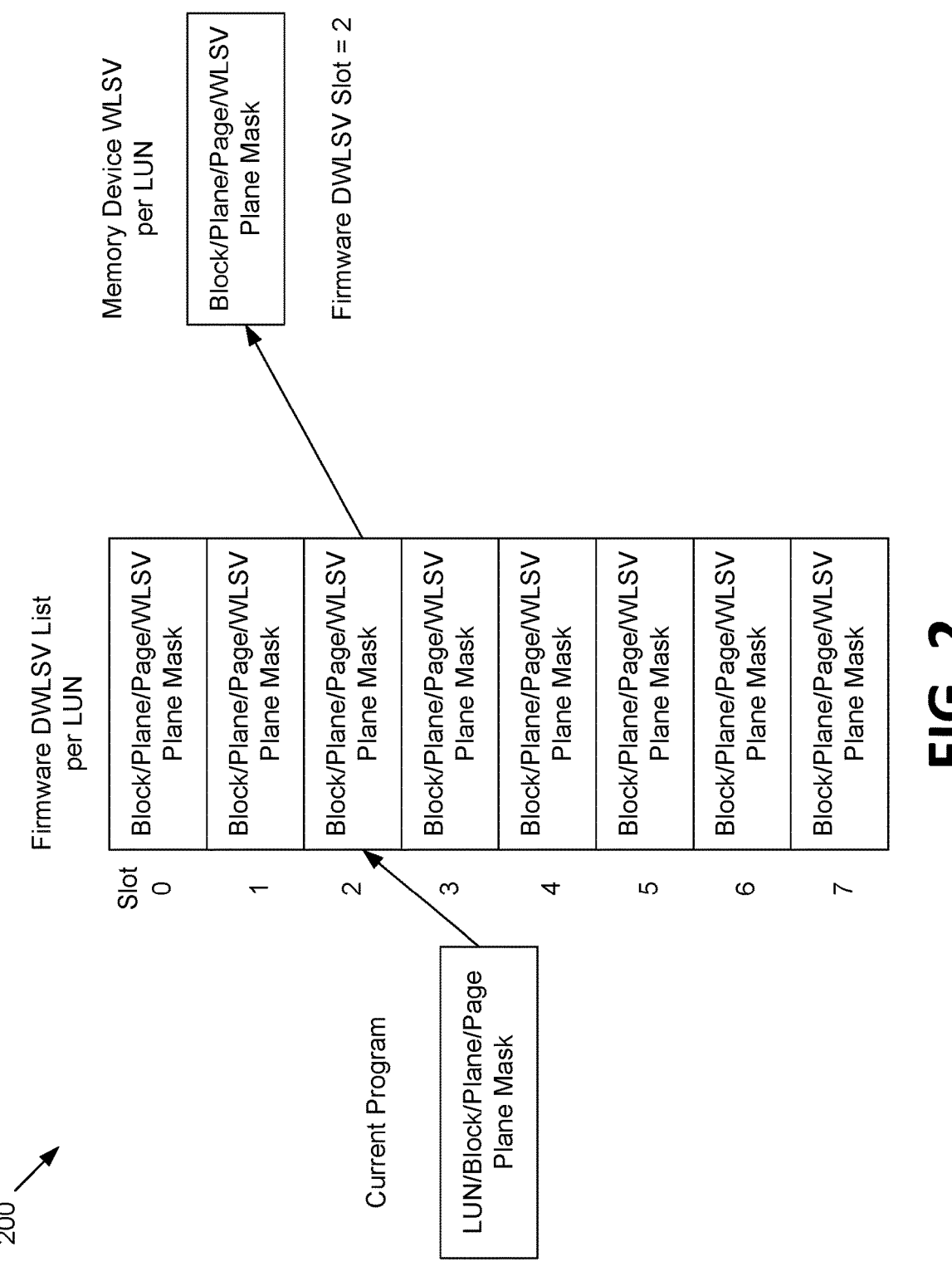
FIG. 2 illustrates an example data structure of a firmware record containing identifying indicia of multiple memory segments of a memory device, in accordance with some embodiments of the present disclosure.

The memory sub-system 110 includes a DWLSV manager 113 that can manually or semi-automatically control WLSV for programming open blocks in the memory devices. The memory sub-system controller 115 can include firmware (f/w) record 114 accessed by the DWLSV manager 113. As shown in FIG. 2, the firmware record 114 can have identifying indicia (such as block index, page index, plane index, plane mask information) etc. stored therein. In some embodiments, the firmware record 114 can be a part of the DWLSV manager 113. In some embodiments, the firmware record 114 can be a part of the local memory 119. In some embodiments, at least a part of the DWLSV manager 113 is part of the host system 110, an application, or an operating system. It is possible that in some embodiments, local media controller 135 includes at least a portion of DWLSV manager 113 and is configured to perform the functionality described herein, though one of the objectives of the present disclosure is to control the DWSLV operation at the firmware level rather than at the memory device level, and therefore local media controller 135 may not have any part of DWLSV manager 113.

FIG. 2 illustrates an example data structure 200 of a firmware record (e.g., firmware record 114) containing identifying indicia of multiple memory segments of a memory device, in accordance with some embodiments of the present disclosure. The term "memory segment" encompasses a block of memory, or a sub-block within a block of memory. A memory segment can include multiple memory pages. The physical cells of a memory block can be distributed among one or more planes. The firmware record 114 can also store plane mask information. The plane mask of firmware record 114 identifies the planes and the status of the memory blocks of those planes (e.g., good or bad). As an example, if the plane mask is 4b'0000, "4b'" identifies that 4 bits are used to describe four planes of the block. "0000" represent the planes and the status of the blocks for the planes. The least significant bit (LSB) (most right position) represents plane 0, the $2^{nd}$ LSB (second most right position) represents plane 1, the second most significant bit (MSB) (second most left position) represents plane 2, and the MSB (most left position) represents plane 3. In some embodiments, more than one of the planes can be planes of the same die. "0" represents a good block. "1" represents a bad block. A bad block is a block that is no longer used to store information. "0000" represents that all the blocks of plane 0-3 are good blocks. "0001" represents that blocks of plane 1-3 are good blocks, and block of plane 0 is a bad block.

In the data structure 200 shown in FIG. 2, an example of firmware record 114 is labeled as firmware DWLSV list per Logical Unit Number (LUN). Each entry of the list has multiple identifying indicia, such as block index, plane index, page index, WLSV value, and plane mask information. Each entry is referred to as a "slot" in the firmware DWLSV list. The slots are numbered as 0, 1, . . . , 7. Though eight slots are shown in the figure, the number of slots can be any arbitrary number that can be supported by the system design. In the example shown in FIG. 2, a current programming request directed to a particular LUN specifies the block index, plane index, and page index. The firmware-based DWSLV manager 113 determines which slot has an open block (e.g., slot 2 in the example shown), retrieves WLSV information stored in the memory device for that slot. After the firmware DWLSV list is managed (i.e. cleared or updated, as discussed below with respect to the flowcharts), the WLSV value can be updated at the memory device to match the stored WLSV value at the firmware.

Figure 3:
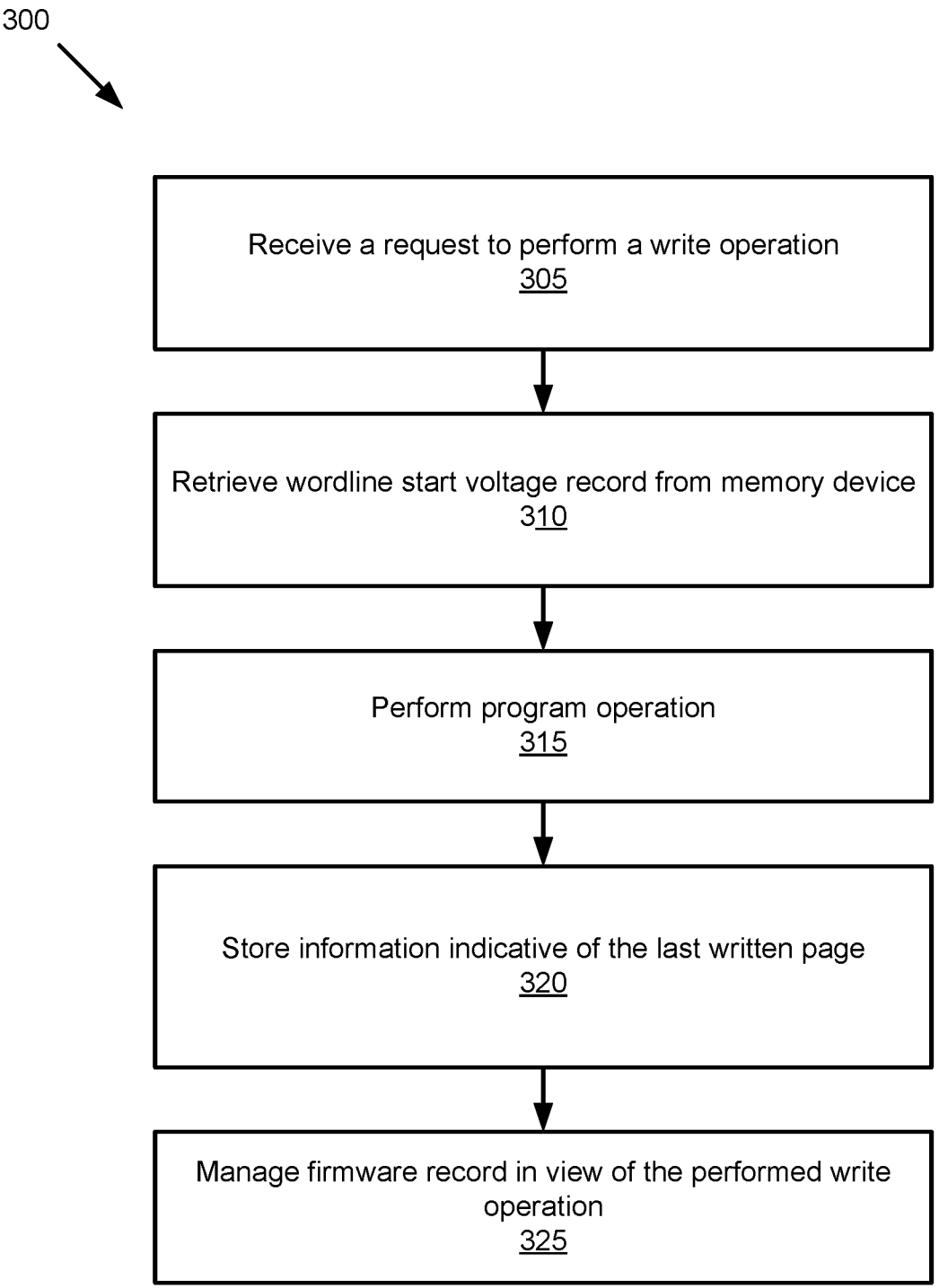
FIG. 3 is a flow diagram of an example method of managing the firmware record in view of a performed write operation, in accordance with embodiments of the present disclosure.

FIG. 3 is a flow diagram of an example method of managing the firmware record in view of a performed write operation, in accordance with embodiments of the present disclosure. The method 300 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 300 is performed by the DWLSV manager 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 305, the processing logic receives a request to perform a write operation at a memory device. Note that "write" operation is sometimes also referred at as "programming" operation. As mentioned above, the memory device has multiple segments (e.g., blocks), each segment containing multiple pages. Note that a block can have multiple sub-blocks, where a sub-block can refer to a collection of pages that are programmed using some common parameters. For example, the collection of pages can be associated with the same wordline with a predetermined (or retrieved) WLSV.

At operation 310, the processing logic retrieves, from the memory device, current WLSV information for a particular segment of the memory device. The segment can be chosen based on whether the segment has additional capacity ("open block") to write more data or not.

At operation 315, the processing logic performs the program operation, i.e. writes data on the memory device. At operation 320, the processing logic stores information (for example at local memory 119) indicative of the last written memory page in the particular memory segment on which the write operation is performed. The last written memory page can indicate whether additional data can be written in the memory segment. The information stored can include one or more identifying indicia, such as block index, plane index, and plane mask of the last written page. In some embodiments, the processing logic can additionally save the WLSV of the last written page. To determine whether to also save the WLSV of the last written place, additional logic operations can be performed, as described in the example flowcharts 400 and 500.

At operation 325, the processing logic manages the firmware record (as described in FIGS. 1 and 2) in view of the performed write operation. Managing the firmware record can involve the operation of determining whether the last written page is a last memory page of multiple pages associated with a common wordline. Responsive to determining that the last written memory page is indeed the last memory page associated with the common wordline, the WLSV in the firmware entry for the particular memory segment is cleared. This operation saves programming time, because a clearing of the firmware entry indicates that the block is not an "open' block, but is rather a closed block. So that there is no need to keep track of WLSV value, and the WLSV value can be reused for subsequent programming operations. On the other hand, if it is determined that the last written memory page is not the last memory page associated with the common wordline, the processing logic updates the WLSV in the firmware entry for the particular memory segment. This way, the open blocks and their WLSVs are tracked. Note that the processing logic can check whether a plane mask for a memory page of the particular memory segment is compatible with the plane mask for another memory page of the particular memory segment. If the plane masks are compatible, then multiple memory pages can be programmed together.

Figure 4:
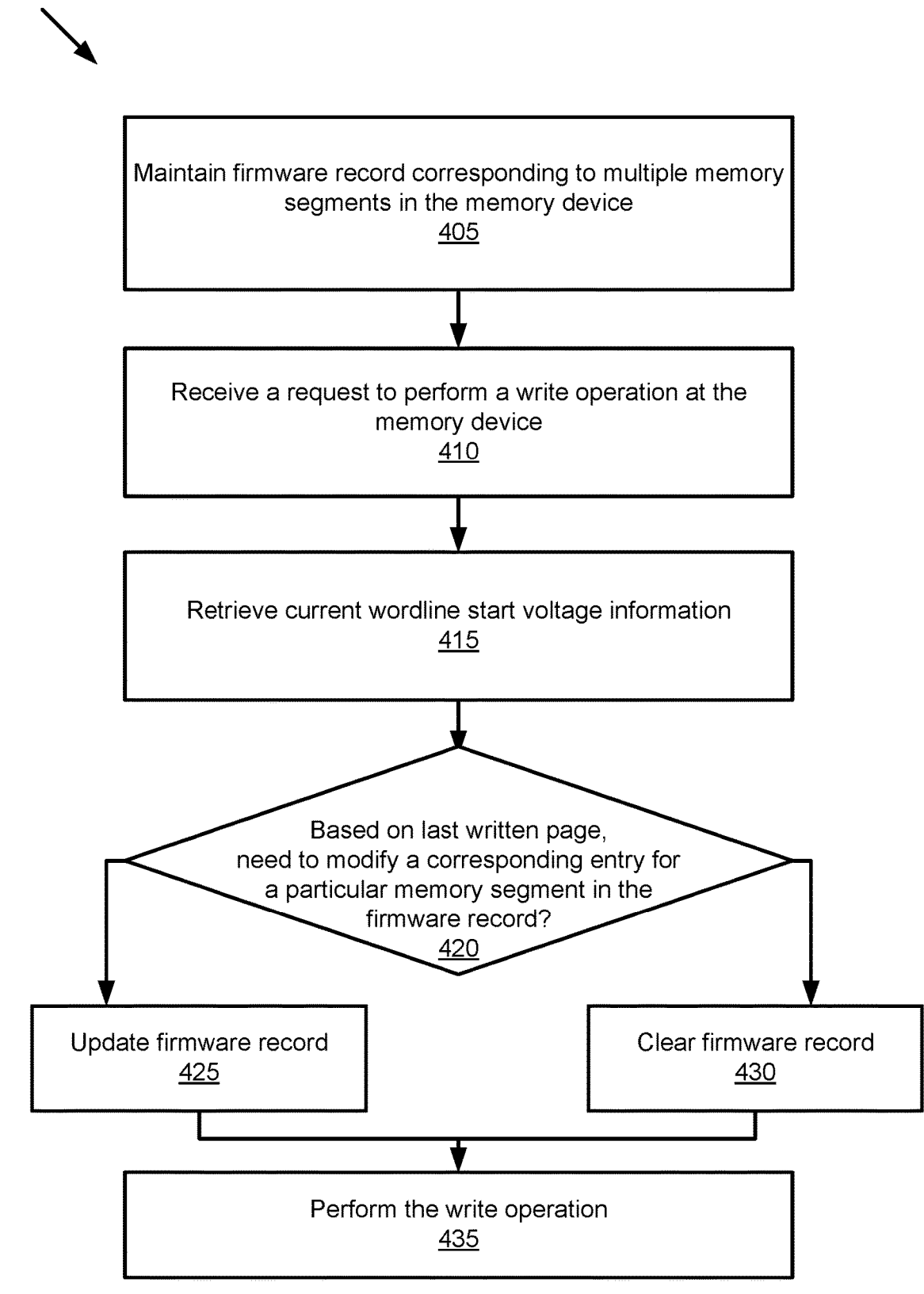
FIG. 4 is a flow diagram of an example method of modifying a firmware record prior to performing a write operation, in accordance with embodiments of the present disclosure.

FIG. 4 is a flow diagram of an example method of modifying a firmware record prior to performing a write operation, in accordance with embodiments of the present disclosure. The method 400 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 400 is performed by the DWLSV manager 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 405, the processing device in the controller 115 maintains a record (such as firmware record 114 in FIG. 1, also shown as firmware DWSLV list 200 in FIG. 2) corresponding to multiple memory segments in a memory device. Each entry of the firmware record includes one or more identifying indicia associated with a respective memory segment of the multiple memory segments. At least one of the identifying indicia is a WLSV associated with the respective memory segment.

At operation 410, the processing device receives a request to perform a write operation at the memory device. This operation is similar to operation 305 in method 300.

At operation 415, the processing logic retrieves current WLSV information associated with a particular memory segment. Note that processing logic can retrieve the current WLSV information from the memory device (as in operation 310 in method 300). In some embodiments, the processing logic can retrieve the WLSV information stored currently in the firmware record, such as firmware DWSLV list 200 shown in FIG. 2.

At operation 420, the processing logic determines, based on at least one of the one or more identifying indicia associated with the particular memory segment and the current WLSV information retrieved from the memory device, whether to modify a corresponding entry for the particular memory segment in the firmware record before the requested write operation is performed. The decision of whether to modify the firmware record involves determining whether the last written memory page is a last memory page of multiple pages associated with a common wordline. Responsive to determining that the last written memory page is indeed the last memory page associated with the common wordline, the WLSV in the firmware entry for the particular memory segment is cleared (operation 430). On the other hand, responsive to determining that the last written memory page is not the last memory page associated with the common wordline, the WLSV in the firmware entry is updated (operation 425) for the particular memory segment. Either way, this modification of the firmware record is performed prior to the write operation (operation 435). Usually MDWLSV management is not performed before the erase operation, but before the write operation.

The subsequent write operation after MDWLSV can use a "Least Recently Used" (LRU) algorithm in order to make space available for a newer entry associated with a newer memory segment. The LRU algorithm checks whether a number of entries of the firmware record satisfies a threshold number of entries. If the number of entries satisfies the threshold number of entries, a command is issued to remove, from the firmware record, the corresponding entry associated with an older memory segment.

Figure 5:
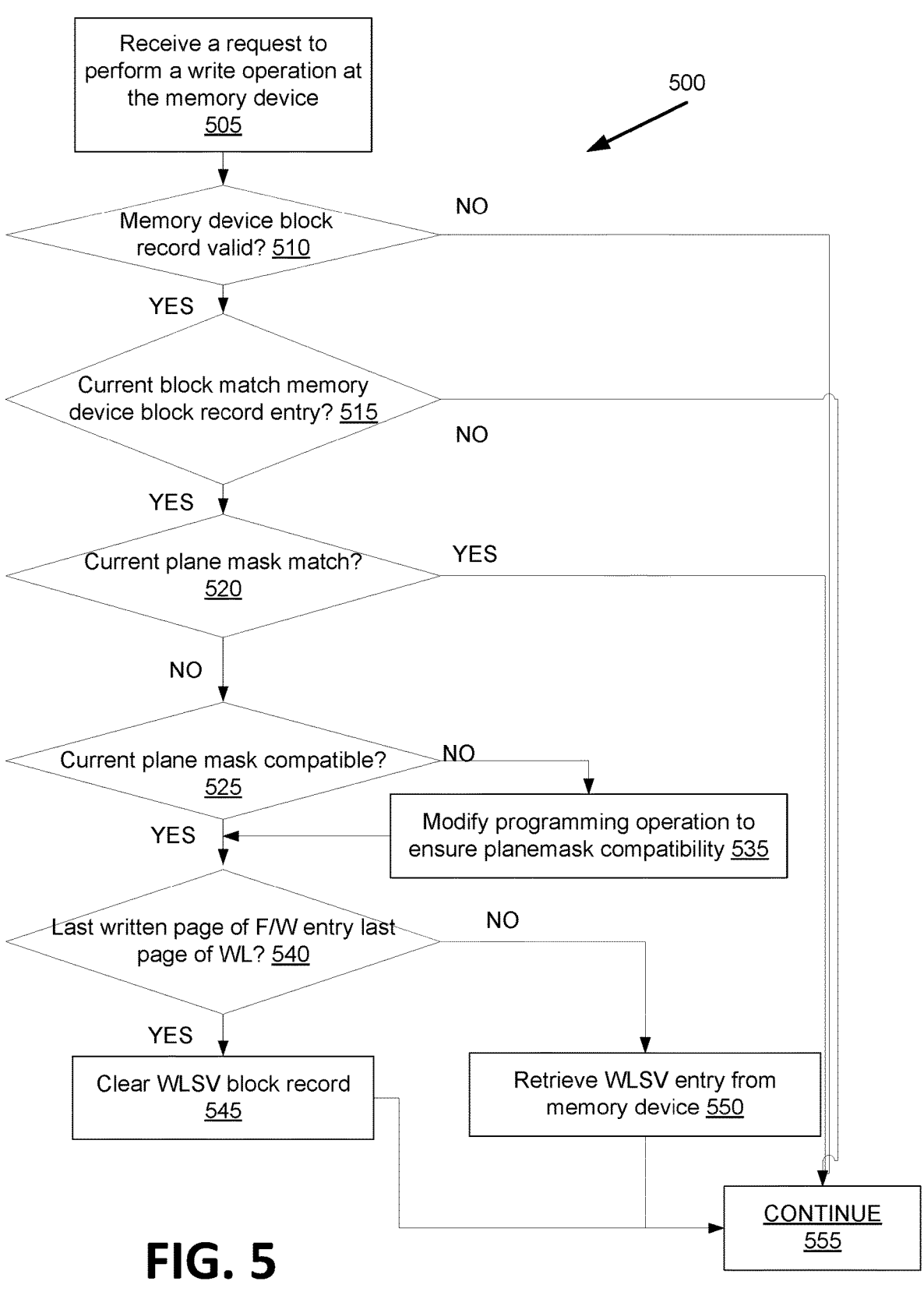
FIG. 5 is a flow diagram of an example method showing various operations for optimizing management of firmware record, in accordance with embodiments of the present disclosure.

FIG. 5 is a flow diagram of an example method showing various operations for optimizing management of firmware record, in accordance with embodiments of the present disclosure. The method 500 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 500 is performed by the DWLSV manager 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 505, the processing logic receives a request to perform a write operation.

At operation 510, the processing logic checks if the block record of the memory device is valid. If the block record is valid, then subsequent optimization operations are performed. Otherwise, regular programming operation is continued at operation 555 without the need or scope for any further optimization.

At operation 515, the processing logic checks if current block matches block record entry retrieved from the memory device. If there is no match, regular programming operation is continued at operation 555 without the optimization. If there is a match, the operation proceeds to 520.

At operation 520, the processing logic checks if plane masks match for multiple pages that can be programmed using a common WL, but are distributed among multiple planes. If the plane masks match, then the method continues at operation 555. On the other hand, the plane masks do not have to exactly match if they are compatible to each other. Compatibility of plane mask means block per plane information is the same between two masks, if not identical. Plane mask compatibility is used to force the memory device to resample. The programming operation can be modified (e.g., a 4-plane operation can be modified to a 3-plane operation if a plane is identified to have 'bad' blocks) to ensure plane mask compatibility. As mentioned above, the plane mask of firmware record 114 identifies the planes and the status of the memory blocks of those planes (e.g., good or bad). As illustrative examples, 4b'1110, 4b'1101, 4b'1011 and 4b'0111 are compatible. However, 4b'1001, 4b'1100 and 4b'0011 are not compatible.

At operation 540, the processing logic checks whether the last written page of the firmware entry is the last page of a wordline. If it is indeed the last page, then the WLSV value for the firmware entry is cleared (operation 545), indicating a closed block. If the last written page is not the last page of the wordline, then the block is still open, and the method proceeds to retrieve WLSV entry from the memory device (operation 550).

Figure 6:
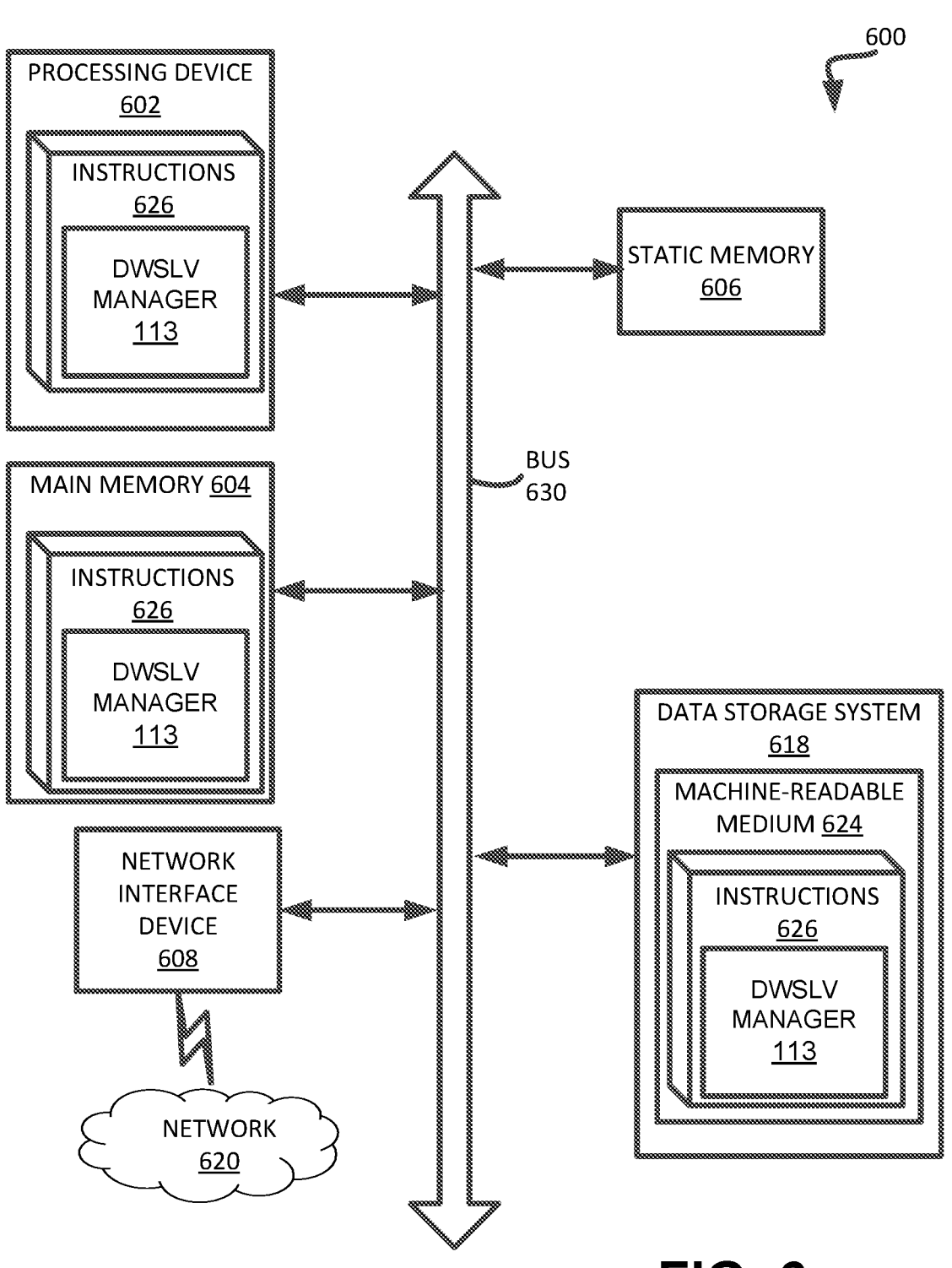
FIG. 6 is a block diagram of an example computer system in which embodiments of the present disclosure can operate.

FIG. 6 illustrates an example machine of a computer system 600 within which a set of instructions, for causing the machine to perform any one or more of the methodologies discussed herein, can be executed. In some embodiments, the computer system 600 can correspond to a host system (e.g., the host system 120 of FIG. 1) that includes, is coupled to, or utilizes a memory sub-system (e.g., the memory sub-system 110 of FIG. 1) or can be used to perform the operations of a controller (e.g., to execute an operating system to perform operations corresponding to the DWLSV manager 113 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 600 includes a processing device 602, a main memory 604 (e.g., read-only memory (ROM), flash memory, dynamic random access memory (DRAM) such as synchronous DRAM (SDRAM) or RDRAM, etc.), a static memory 606 (e.g., flash memory, static random access memory (SRAM), etc.), and a data storage system 618, which communicate with each other via a bus 630.

Processing device 602 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 602 can also be one or more special-purpose processing devices such as an application specific integrated circuit (ASIC), a field programmable gate array (FPGA), a digital signal processor (DSP), network processor, or the like. The processing device 602 is configured to execute instructions 626 for performing the operations and steps discussed herein. The computer system 600 can further include a network interface device 608 to communicate over the network 620.

The data storage system 618 can include a machine-readable storage medium 624 (also known as a computer-readable medium) on which is stored one or more sets of instructions 626 or software embodying any one or more of the methodologies or functions described herein. The instructions 626 can also reside, completely or at least partially, within the main memory 604 and/or within the processing device 602 during execution thereof by the computer system 600, the main memory 604 and the processing device 602 also constituting machine-readable storage media. The machine-readable storage medium 624, data storage system 618, and/or main memory 604 can correspond to the memory sub-system 110 of FIG. 1.

In one embodiment, the instructions 626 include instructions to implement functionality corresponding to a DWLSV manager component (e.g., the DWLSV manager 113 of FIG. 1). While the machine-readable storage medium 624 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A method comprising:

maintaining a firmware record corresponding to a plurality of memory segments of a memory device, each entry of the firmware record comprising a plurality of identifying indicia associated with a respective memory segment of the plurality of memory segments, a first identifying indicia being a wordline start voltage (WLSV) associated with the respective memory segment, and a second identifying indicia being a plane mask associated with the respective memory segment;

receiving a request to perform a write operation at the memory device;

selecting, based on the first identifying indicia and the second identifying indicia, a plurality of memory pages to be programmed using a common world line having a specific WLSV, the plurality of memory pages being distributed among different planes in the memory device.

2. The method of claim 1, wherein selecting the plurality of memory pages further comprises:

checking, based on the second identifying indicia, whether a first plane mask for a first memory page is compatible with a second plane mask for a second memory page.

3. The method of claim 1, wherein the different planes span across two or more memory segments of the plurality of memory segments.

4. The method of claim 3, wherein selecting the plurality of memory pages further comprises:

checking, based on the respective second identifying indicia of each memory segment of the two or more memory segments, whether a first plane mask for a first memory page of a first memory segment is compatible with a second plane mask for a second memory page of a second memory segment.

5. The method of claim 1, further comprising:

performing a multi-plane write operation to program the plurality of memory pages using the common wordline having the specific WLSV.

6. The method of claim 5, wherein the plane mask comprises information about respective status of each memory segment of the plurality of memory segments.

7. The method of claim 6, wherein if a status of a particular memory segment is indicated as '0' in the plane mask, then that particular memory segment is deemed suitable to store information during the multi-plane write operation.

8. The method of claim 6, wherein if a status of a particular memory segment is indicated as '1' in the plane mask, then that particular memory segment is deemed not suitable to store information during the multi-plane write operation.

9. The method of claim 8, wherein performing the multi-plane write operation further comprises:

excluding planes containing memory segments that are deemed not suitable to store information during the multi-plane write operation.

10. The method of claim 5, further comprising:

updating the firmware record after completion of the multi-plane write operation.

11. A system comprising:

a memory device, wherein the memory device comprises a plurality of memory segments, each of the plurality of memory segments comprising a plurality of memory pages distributed among different planes in the memory device; and a processing device, operatively coupled to the memory device, performing operations comprising:

maintaining a firmware record corresponding to a plurality of memory segments of a memory device, each entry of the firmware record comprising a plurality of identifying indicia associated with a respective memory segment of the plurality of memory segments, a first identifying indicia being a wordline start voltage (WLSV) associated with the respective memory segment, and a second identifying indicia being a plane mask associated with the respective memory segment;

receiving a request to perform a write operation at the memory device;

selecting, based on the first identifying indicia and the second identifying indicia, a plurality of memory pages to be programmed using a common world line having a specific WLSV.

12. The system of claim 11, wherein to select the plurality of memory pages, the processing device further performs an operation comprising:

checking, based on the second identifying indicia, whether a first plane mask for a first memory page is compatible with a second plane mask for a second memory page.

13. The system of claim 11, wherein the different planes span across two or more memory segments of the plurality of memory segments.

14. The system of claim 13, wherein to select the plurality of memory pages, the processing device further performs an operation comprising:

checking, based on the respective second identifying indicia of each memory segment of the two or more memory segments, whether a first plane mask for a first memory page of a first memory segment is compatible with a second plane mask for a second memory page of a second memory segment.

15. The system of claim 11, wherein the processing device further performs an operation comprising:

performing a multi-plane write operation to program the plurality of memory pages using the common wordline having the specific WLSV.

16. The system of claim 15, wherein the plane mask comprises information about respective status of each memory segment of the plurality of memory segments.

17. The system of claim 16, wherein if a status of a memory is indicated as '0' in the plane mask, then that memory segment is deemed suitable to store information during the multi-plane write operation.

18. The system of claim 16, wherein if a status of a memory segment is indicated as '1' in the plane mask, then that memory segment is deemed not suitable to store information during the multi-plane write operation.

19. The system of claim 18, wherein performing the multi-plane write operation further comprises:

excluding planes containing memory segments that are deemed not suitable to store information during the multi-plane write operation.

20. The method of claim 5, further comprising:

updating the firmware record after completion of the multi-plane write operation.

* * * * *